United States Patent [19]
Henry et al.

[11] Patent Number: 5,092,956
[45] Date of Patent: Mar. 3, 1992

[54] DEVICE FOR MECHANICALLY STABILIZING WEB RIBBON BUTTONS DURING GROWTH INITIATION

[75] Inventors: Paul K. Henry, Altadena; Edward P. Fortier, La Crescenta, both of Calif.

[73] Assignee: The United States of America as represented by the United States National Aeronautics and Space Administration, Washington, D.C.

[21] Appl. No.: 311,376

[22] Filed: Feb. 10, 1989

Related U.S. Application Data

[63] Continuation of Ser. No. 102,934, Sep. 30, 1987, abandoned.

[51] Int. Cl.⁵ .............................................. C30B 15/22
[52] U.S. Cl. .................... 156/617.1; 156/608; 156/620.1; 156/620.3; 156/620.4; 156/DIG. 64; 156/DIG. 84; 156/DIG. 88; 422/246; 422/249
[58] Field of Search ................ 156/608, 617.1, 620.1, 156/620.3, 620.4, DIG. 64, DIG. 84, DIG. 88, DIG. 98; 422/246, 249

[56] References Cited

U.S. PATENT DOCUMENTS

| | | | |
|---|---|---|---|
| 2,979,386 | 4/1961 | Shockley et al. | 422/249 |
| 3,025,146 | 3/1962 | Runyan | 156/608 |
| 3,162,507 | 12/1964 | Dermatis et al. | 156/DIG. 84 |
| 3,961,906 | 6/1976 | Keller | 156/620 |
| 4,045,183 | 8/1977 | Barowski et al. | 156/620 |
| 4,060,392 | 11/1977 | Herzer et al. | 156/620 |
| 4,140,571 | 2/1979 | Herzer et al. | 156/DIG. 98 |
| 4,190,630 | 2/1980 | Apitat et al. | 422/249 |
| 4,257,841 | 3/1981 | Ross et al. | 156/DIG. 98 |
| 4,267,153 | 5/1981 | Taylor | 156/DIG. 88 |
| 4,594,127 | 6/1986 | Lane et al. | 156/DIG. 98 |

OTHER PUBLICATIONS

Duncan et al., Development of Processes for the Production of Low Cost Silicon Web, Conference, 14th IEEE Photovoltaic Specialists, San Diego, 1980, pp. 25 to 30.

Barrett et al., Growth of Wide, Flat Crystals of Silicon Web, Journal of Electrochemical Society, Solid State Science, vol. 118, No. 6 (Jun. 1971), pp. 952-957.

*Primary Examiner*—Robert Kunemund
*Attorney, Agent, or Firm*—Thomas H. Jones; John R. Manning

[57] ABSTRACT

The invention relates to a stabilization device for stabilizing dendritic web seed buttons during initiation of crystal growth from a float zone melt. The invention includes angular maintenance means for maintaining a constant angular orientation between the axis of a growth initiation seed and the upper surface of a web button during withdrawal of the web button from the melt. In the preferred embodiment, the angular maintenance means includes an adjustable elevation tube which surrounds the seed, the weight of which may be selectively supported by the seed button during web button withdrawal.

19 Claims, 1 Drawing Sheet

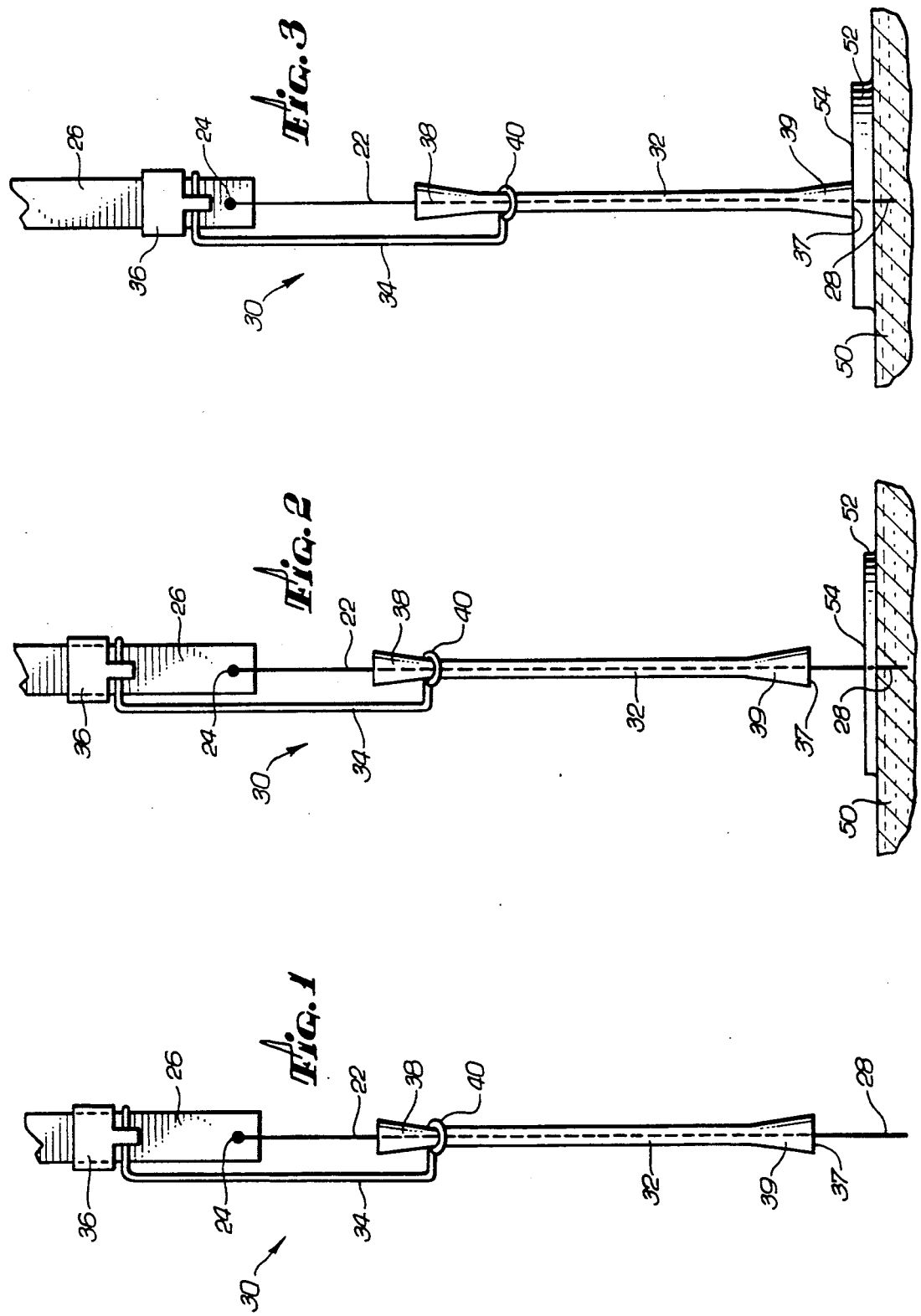

DEVICE FOR MECHANICALLY STABILIZING WEB RIBBON BUTTONS DURING GROWTH INITIATION

Origin of the Invention

The invention described herein was made in the performance of work under a NASA contract, and is subject to the provisions of Public Law 96-517 (35 USC 202) in which the Contractor has elected not to retain title.

This application is a continuation of application Ser. No. 102,934, filed Sept. 30, 1987, now abandoned.

BACKGROUND OF THE INVENTION

1. Field of the Invention

The present invention relates to semiconductor crystal growth, and more particularly, to growth of dendritic web ribbon semiconductor crystals from a semiconductor melt.

2. Description of the Prior Art

In the past, a well known method of forming dendritic semiconductor web ribbons has been to immerse a crystal seed having the desired crystallographic orientation into a semiconductor melt. A crystal web button then forms about the seed at the surface of the melt. Once the seed button reaches a desired width, the seed is slowly withdrawn from the melt, causing the web button to grow in length.

One disadvantage of the conventional process described above has been the practical limitations placed upon the width to which the button may be allowed to grow prior to initiating the upward pull to start ribbon growth. The primary constraint on this width, and therefore the initial area rate of crystal growth, has been the large asymmetrical forces which develop on the seed button about the seed during initial button seed withdrawal. Since the seed is near its melting point, the large asymmetrical forces tend to bend it, causing the web button to tip. If the web button tips a sufficient amount, web growth will be lost due to disruption of crystallographic orientation of the ribbon, and rupture of the liquid semiconductor meniscus.

SUMMARY OF THE INVENTION

The present invention relates to an apparatus for stabilizing web buttons during initiation of dendritic web ribbon crystal growth. The invention includes angular maintenance means for maintaining a constant angular orientation between the axis of the seed and the upper surface of the web button during withdrawal of the button from the melt. The angular maintenance means includes a tube which surrounds a length of the seed and a sliding suspension mechanism which supports the tube. After the button has formed from the seed within the semiconductor melt, the seed with the button attached is elevated slightly from the semiconductor melt to expose the upper surface of a dendritic web button. The sliding suspension mechanism is then lowered, allowing the lower end of the tube to come to rest upon the upper surface of the dendritic web button. The relatively large weight of the tube on the web button tends to maintain constant symmetrical forces on the web button about the seed. As a result, the angular orientation between the axis of the seed and the surface of the seed button remains relatively fixed even with large asymmetries of the button. The seed thus does not bend, and the web button does not tip. As a result, ribbon growth may routinely be initiated at widths larger than previously attainable, resulting in a higher average ribbon area output per unit time.

BRIEF DESCRIPTION OF THE DRAWINGS

FIG. 1 illustrates a side view of the dendritic web seed button stabilization device of the present invention.

FIG. 2 illustrates a side view of the stabilization device illustrated in FIG. 1 as the seed is lifted in response to raising the level of the tape.

FIG. 3 illustrates a side view of the stabilization device of FIG. 2 after the sliding mechanism has been lowered.

DETAILED DESCRIPTION OF THE PREFERRED EMBODIMENT

The following description is of the best presently contemplated mode of carrying out the present invention. This description is made for the purposes of illustrating the general principles of the invention and is not to be taken in a limiting sense. The scope of the invention is best determined by reference to the appended claims.

The preferred embodiment of the stabilizing and supporting apparatus of the present invention is illustrated in FIG. 1. As with conventional semiconductor melt growth initiation devices, a quantity of semiconductor material is placed within a crucible (not shown) and is melted within a furnace. A crystal growth initiation seed 22 having the desired crystallographic orientation is provided having one end 24 attached to a seed holder or seed suspension portion of a tape 26. The opposite end 28 of the seed remains free to be lowered into the melt to initiate semiconductor ribbon growth about the seed 22. The level of the end 28 with respect to the melt may be selectively varied by moving the seed 22 in the vertical direction by manipulation of the seed holder or the seed suspension portion of the tape 26. Preferably, the seed holder or tape 26 are formed of stainless steel or a similar material which is resistant to the extreme temperatures of the furnace environment.

The present invention is unconventional in that it also includes a mechanical stabilization device 30 which may be brought into contact with the web button which forms about the end 28 of the seed 22 in order to stabilize the angular orientation of the web button with respect to the seed. In the embodiment of the present invention illustrated in FIG. 1, the stabilization device includes a tube 32 which surrounds a portion of the seed 22. The tube 32 is slidably engaged about the seed 22 and may be selectively lifted by a wire support 34 connected to a sliding support mechanism 36. The sliding support mechanism 36 encircles the seed holder or the seed suspension portion of the tape 26 and allows vertical movement of the tube 32 with respect to both the seed 22 and the seed holder or suspension portion of the tape 26. The sliding support mechanism 36 and wire support 34 should preferably be formed of stainless steel to withstand the extreme temperatures of the furnace. The tube should preferably be formed of a refractory material such as molybdenum or quartz or the like which can withstand the extreme temperatures of the furnace and occasional contact with newly formed web buttons at approximately the melting point of the semiconductor material. The tube contains engagement means which engage with the wire support 34 to allow the tube to become raised and or lowered in response to the raising and/or lowering of the wire support 34. As illustrated for the embodiment of FIG. 1, the engagement means includes an outward flaring 38 at the upper portion of the tube. The wire support 34 contains a portion 40 which encircles the tube at its smallest diameter, and may slide about the periphery of the tube at the points having the same diameter. When the wire support 34 is raised a sufficient distance such that the portion 40 engages the flared end 38 of the tube, the tube 32 may be selectively raised with respect to the seed. In addition, the tube should have a flat surface 37 at its lower end 39, the lower end preferably being symmetrical in shape about the seed.

Alternate methods of selectively raising and lowering the level of the tube 34 may also be utilized. For example, a radially extending ring or peg (not shown) may be provided on the exterior of the refractory tube. The ring or peg may therefore be engaged by the wire support when the wire support is raised a preselected distance with respect to the tube.

The stabilizing and supporting apparatus of the present invention operates in the following manner. Initially, as shown in FIG. 1, the seed 22 is suspended through the tube 32. The sliding support mechanism 36 is in a raised position with respect to the seed holder or tape 26 such that the flared end 38 of the tube 32 is engaged by the portion 40 of the wire support 34. The tube 32 is therefore supported by the wire support. The lower end 28 of the seed 22 should initially extend below the lower end 39 of the tube.

Thereafter, as illustrated in FIG. 2, the entire support and stabilizing apparatus are positioned over the semiconductor melt 50 within the furnace. The apparatus is then lowered, allowing the lower end of the seed to be immersed within the melt 50. A web button 52 of semiconductor crystal having an upper surface 54 perpendicular to the axis of the seed 22 then commences to form around the seed. As with conventional growth initiation devices, the seed holder or the suspension portion of the tape 26 is then slowly elevated with respect to the melt, raising the seed 22 and a portion of the web button 52 above the surface of the melt 50. When the web button 52 has been elevated a preselected distance, for example approximately two millimeters, the sliding support mechanism 36 is lowered with respect to the suspension tape 26, the seed 22, and the web button 52 such that the flat surface 37 of the lower end 39 of the tube comes to rest upon the upper surface 54 of the web button, as illustrated in FIG. 3. The sliding support mechanism 36 should preferably be lowered a sufficient distance to assure that the tube becomes disengaged from the wire support and the entire weight of the tube 32 is completely supported by the web button 52. The weight of the tube 22 on the web button 52 increases the likelihood that forces are distributed symmetrically on the web button during button withdrawn at the initiation of web ribbon growth. The relative angle between the axis of the seed and the upper surface of the web button should therefore be stabilized at approximately 90°.

Once the lower end 39 of the tube 32 has come into contact with the web button, and the weight of the tube is entirely supported by the web button 52, the entire stabilization apparatus may then commence to be elevated with respect to the semiconductor melt. The tape 26, seed 22, sliding support mechanism 36, wire support 34 and tube 32 may thus be lifted vertically, elevating the growth initiation button 52 to stimulate crystal growth at the surface of the melt 50. Since the weight of the tube on the growth initiation web button reduces the likelihood of the development of asymmetrical forces on the web button about the seed, the seed is less likely to bend and the web button is less likely to tip. As a result, the crystallographic orientation of the web button remains approximately constant with respect to the melt, a factor necessary for the initiation of high quality crystalline structure ribbon. In addition, the stabilization device allows ribbons to be initiated at larger widths than previously possible, thereby reducing the time required to reach full production ribbon width.

It should be noted that a greater degree of stabilization of the web button will occur if the tube has a weight much larger than the asymmetrical forces typically experienced by the web button during withdrawal of the seed from the melt. Of course, factors such as the tensile strength of the seed may place constraints on the weight of the tube which may be utilized. In addition, stabilization may also be increased by forming the perimeter of the lower portion 37 of the end 39 symmetrically about the seed passing therethrough, thus assuring that the mass of the tube is distributed symmetrically about the axis of the seed on the surface of the web button. Of course, the effect of the shape of the perimeter of the lower end of the tube is more critical to stabilization of the web button for smaller perimeter tubes than for larger perimeter tubes.

As described above, the tube is preferably engageable by the wire support such that the tube may be either selectably elevated by elevation of the wire support or allowed to rest entirely upon the web button by lowering the wire support a sufficient distance to assure that the wire support no longer engages with the tube. Alternately, the wire support and tube may be fixedly attached to one another such that vertical movement of the wire support in either direction will necessarily always result in corresponding vertical movement of the tube. In such a case, however, it may be necessary to verify that the wire support is not supporting the tube when the entire weight of tube is desired to be rested upon the web button.

As may easily be concluded from reference to the above description, the present invention is not intended to be limited to the specific embodiment illustrated in the figures. Rather, the present invention is intended to encompass other devices which maintain a constant angular orientation between the axis of the seed and the surface of the web button during crystal growth.

We claim:

1. An apparatus for growing dendritic web ribbons from a semiconductor melt, comprising:

a crystal seed having a central axis, a first end and a second end, the first end being immersible within a semiconductor melt to initiate growth of a web button about said first end, said web button having an upper surface;

support means attached to said second end for supporting said crystal seed and for withdrawing said crystal seed from said semiconductor melt to initiate crystal growth of the dendritic web ribbon at a dendritic web crystal growth melt front and to raise the upper surface of the web button to a position displaced from the semiconductor melt;

stabilization means for applying a stabilizing force to said button at the upper surface thereof, thereby stabilizing the angular orientation of said central axis of said crystal seed with respect to said web button during said initiation of crystal growth of the dendritic web ribbon.

2. An apparatus according to claim 1, wherein said stabilization means comprises a body supported on said web button, said body having a weight as determined according to the degree of stability desired.

3. An apparatus according to claim 2, wherein said body contacts said web button symmetrically about said seed when said body is supported by said web button.

4. An apparatus according to claim 2, wherein said body comprises a tube surrounding said crystal seed.

5. An apparatus according to claim 2, wherein said body is formed of a refractory material.

6. An apparatus according to claim 5, wherein said refractory material is molybdenum.

7. An apparatus according to claim 5, wherein said refractory material is quartz.

8. An apparatus according to claim 2, further comprising elevation control means for controlling the elevation of said body with respect to said crystal seed.

9. An apparatus according to claim 8, wherein said elevation control means comprises a vertically movable support which is engagable with said body to support said body.

10. An apparatus according to claim 1, wherein said support means is formed of stainless steel.

11. A method of growing semiconductor dendritic web crystals, comprising:
providing a crystal seed having a central axis and an end;
immersing said end of said crystal seed into a semiconductor melt to initiate the growth of a seed button about said end; and
stabilizing the angular orientation of said seed button with respect to said axis of said crystal seed by application of a stabilizing force to said seed button at a position displaced from said crystal seed while withdrawing said end of said crystal seed and said seed button from said semiconductor melt.

12. A method according to claim 11, wherein said seed button has an upper surface and said stabilization step comprises resting a body having a weight as determined according to the degree of stability desired on the upper surface of said seed button.

13. A method according to claim 11, wherein said seed button has an upper surface, and said stabilization steep comprises lowering a body which is approximately symmetrical about the crystal seed and having a weight as determined according to the degree of stability desired onto the upper surface of said seed button.

14. An apparatus for growing dendritic web ribbons from a semiconductor melt, comprising:
seed means for initiating growth of a web button at the surface of the semiconductor melt, said web button having a first surface in contact with said seed means and a second surface in contact with the semiconductor melt;
means for gradually lifting the web button from the semiconductor melt; and
stabilizing means, mechanically coupled so as to move with the web button, for providing a substantially symmetrical force to said first surface of said web button at a location displaced from said seed means as said web button is being initially lifted so as to substantially maintain the orientation of the web button as it is being lifted.

15. An apparatus according to claim 14, wherein the stabilizing means includes a symmetrical stabilizing body of a weight as determined according to the degree of stability desired, the stabilizing body being supported on the web button.

16. A method of growing semiconductor dendritic web crystals from a seed crystal, comprising the steps of:
forming a laterally extending web button at the surface of a semiconductor melt by inserting the seed crystal into the melt so as to provide lateral crystal growth;
gradually lifting the web button from the semiconductor melt so as to allow vertical crystal growth between the semiconductor melt and the web button; and
pressing on the web button symmetrically about the seed crystal as it is being initially lifted thereby to provide a substantially balanced torque about the seed crystal and maintain the orientation of the web button as it is being lifted.

17. A method according to claim 16, wherein the pressing step includes resting a symmetrical stabilizing body on the web button, wherein the weight of the stabilizing body is determined according to the degree of stability desired.

18. An apparatus for growing dendritic web ribbons from a semiconductor melt as set out in claim 1, wherein said stabilization means is composed of a material having a higher melting temperature than the semiconductor material comprising the semiconductor melt.

19. An apparatus for growing dendritic web ribbons from a semiconductor melt as set out in claim 14, wherein said stabilization means is composed of a material having a higher melting temperature than the semiconductor material comprising the semiconductor melt.

* * * * *